United States Patent
Stiens et al.

(10) Patent No.: US 10,662,524 B2
(45) Date of Patent: May 26, 2020

(54) TOOL WITH TIAIN COATING (71) Applicant: WALTER AG, Tubingen (DE)

(72) Inventors: Dirk Stiens, Reutlingen (DE); Thorsten Manns, Tubingen (DE)

(73) Assignee: Walter AG, Tubingen (DE)

( * ) Notice: Subject to any disclaimer, the term of this patent is extended or adjusted under 35 U.S.C. 154(b) by 165 days.

(21) Appl. No.: 15/747,471

(22) PCT Filed: Jul. 6, 2016

(86) PCT No.: PCT/EP2016/065908
§ 371 (c)(1),
(2) Date: Jan. 25, 2018

(87) PCT Pub. No.: WO2017/016826
PCT Pub. Date: Feb. 2, 2017

(65) Prior Publication Data
US 2018/0216224 A1 Aug. 2, 2018

(30) Foreign Application Priority Data

Jul. 27, 2015 (EP) ..................... 15178477

(51) Int. Cl.
B23B 27/14 (2006.01)
C23C 16/36 (2006.01)
(Continued)

(52) U.S. Cl.
CPC ............ *C23C 16/36* (2013.01); *B23B 27/148* (2013.01); *C23C 16/34* (2013.01); *C23C 16/403* (2013.01);
(Continued)

(58) Field of Classification Search
USPC ................. 51/307, 309; 427/255.23, 255.28, 427/255.36, 255.391, 255.7, 372, 419.2,
(Continued)

(56) References Cited

U.S. PATENT DOCUMENTS

| 2008/0273933 | A1* | 11/2008 | Ahlgren | C23C 14/0641 407/119 |
| 2012/0219789 | A1* | 8/2012 | Endler | C23C 16/34 428/335 |
| 2015/0064452 | A1* | 3/2015 | Pitonak | C23C 16/34 428/336 |

FOREIGN PATENT DOCUMENTS

| DE | 102009046667 A1 | 5/2011 |
| EP | 3000913 A1 | 3/2016 |

(Continued)

OTHER PUBLICATIONS

Stiens et al "CVD Titanium Aluminum Nitride Coatings for Cutting Applications" 41st ICMCTF (Year: 2014).*
(Continued)

*Primary Examiner* — Archene A Turner
(74) *Attorney, Agent, or Firm* — Corinne R. Gorski (57) ABSTRACT A tool having includes a base body of cemented carbide, cermet, ceramics, steel or high-speed steel and a single-layer or multi-layer wear protection coating deposited thereon by CVD process and having a thickness within the range of from 2 μm to 25 μm. The wear protection coating has at least a $Ti_{1-x}Al_xC_yN_z$ layer with $0.40 \leq x \leq 0.95$, $0 \leq y \leq 0.10$ and $0.85 \leq z \leq 1.15$ having a thickness in the range of from 1 μm to 16 μm and having >85 vol-% face-centered cubic (fcc) crystal structure. The $Ti_{1-x}Al_xC_yN_z$ layer includes precipitations of $Ti_{1-o}Al_oC_pN_q$ at the grain boundaries of the $Ti_{1-x}Al_xC_yN_z$ crystallites have a higher Al content than inside the crystallites, wherein $0.95 \leq o \leq 1.00$, $0 \leq p \leq 0.10$, $0.85 \leq q \leq 1.15$ and $(o-x) \geq 0.05$.

19 Claims, 4 Drawing Sheets (51) Int. Cl.
 *C23C 16/34* (2006.01)
 *C23C 16/56* (2006.01)
 *C23C 16/40* (2006.01)

(52) U.S. Cl.
 CPC .......... *C23C 16/56* (2013.01); *B23B 2224/32* (2013.01); *B23B 2228/04* (2013.01); *B23B 2228/105* (2013.01)

(58) Field of Classification Search
 USPC ..... 427/419.7; 428/216, 325, 336, 697, 698, 428/699, 701, 702; 407/119
 See application file for complete search history.

(56) References Cited

FOREIGN PATENT DOCUMENTS

| JP | 2001341008 | * | 12/2001 |
|---|---|---|---|
| JP | 2008264890 | * | 11/2008 |
| JP | 2013116509 | * | 6/2013 |
| JP | 2014097536 | * | 5/2014 |
| JP | 2015052133 A | | 3/2015 |

OTHER PUBLICATIONS

Todt et al "Superior oxidation resistance, mechanical properties and residual stress of an Al-rich nanolamellar Ti(0.05)Al(0.95)N coating prepared CVD" Surfce & Coatings Technology 258 (2014) p. 1119-1127. (Year: 2014).*

Keckes et al "Self-organized periodic soft-hard nanolamellae in polycrystalline TiAlN thin films" Thin Solid Films 545 (2013) p. 29-32. (Year: 2013).*

Chen et al "Thermal stability and oxidation resistance of Ti—Al—N coatings" Surface & Coatings Technology 206 (20120) p. 2954-2960. (Year: 2008).*

Endler et al "Aluminum-rich TiAlCN coatings by Low Pressure CVD" Surface & Coatings Technology 205 (2010) p. 1307-1312. (Year: 2010).*

Endler et al "Novel aluminum-rich Ti(1-x)Al(X)N coatings by LPCVD." Surface &Coatings Technology 203 (2008) p. 530-533. (Year: 2008).*

* cited by examiner

TOOL WITH TIAIN COATING

RELATED APPLICATION DATA

This application is a § 371 National Stage Application of PCT International Application No. PCT/EP2016/065908 filed Jul. 16, 2017 claiming priority to EP 15178477.4 filed Jul. 27, 2015.

FIELD OF THE INVENTION

The present invention relates to a tool having a base body of cemented carbide, cermet, ceramics, steel or high-speed steel and a single-layer or multi-layer wear protection coating deposited thereon in the CVD process and having a thickness within the range of from 2 µm to 25 µm, wherein the wear protection coating comprises at least a $Ti_{1-x}Al_x C_y N_z$ layer with $0.40 \leq x \leq 0.95$, $0 \leq y \leq 0.10$ and $0.85 \leq z \leq 1.15$ having a thickness in the range of from 1 µm to 16 µm and having >85 vol-% face-centered cubic (fcc) crystal structure. The present invention further relates to a process for the production of the inventive tool.

BACKGROUND OF THE INVENTION

Tools for the chip forming metal machining consist of a substrate body of cemented carbide, cermet, ceramics, steel or high-speed steel which in the most cases is provided with a single-layer or multi-layer hard material coating for the improvement of the cutting properties and/or the wear properties. The hard material coating consists of layers of mono-metallic or mixed-metallic hard material phases. Examples of mono-metallic hard material phases are TiN, TiC, TiCN, AlN and $Al_2O_3$. Examples of mixed-metallic phases, wherein within one crystal a metal is in part replaced by another one, are TiAlN and TiAlCN. Coatings of the afore-mentioned type are deposited by CVD processes (chemical vapor deposition), PCVD processes (plasma-enhanced CVD processes) or by PVD processes (physical vapor deposition).

In almost every material there are residual stresses due to the manufacturing process and/or of mechanical, thermal and/or chemical treatment. During the production of tools by coating of a substrate body by CVD processes, residual stresses, for example between the coating and the substrate and between the individual layers of the coating, respectively, result from the different coefficients of thermal expansion of the materials. The residual stresses can be tensile stresses or compressive stresses. In coatings deposited by PVD processes, in general, there exist residual compressive stresses due to, amongst other reasons, the ion bombardment in this process. In contrast to that, CVD processes usually generate residual tensile stresses in the coating.

There is distinguished between three types of residual stresses: macro-stresses that are almost homogenously distributed across macroscopical regions of the material, micro-stresses that are homogenous within microscopic regions, such as for example within a grain, and inhomogeneous micro-stresses that are inhomogeneous even at a microscopic level. From a practical point of view and for the mechanical properties of a cutting tool the macro-stresses are of particular importance.

The residual stresses in hard material coatings can have a significant influence on the properties of the coatings with advantageous or disadvantageous effects on the wear resistance of the tool. Residual tensile stresses exceeding the tension limit of the respective material can cause fractures and cracks in the coating perpendicular to the direction of the residual tensile stress. In general, a particular amount of residual compressive stress in the coating is desired, because it avoids and closes surface cracks and improves the fatigue properties of the coating and thereby of the tool. However, too high residual compressive stresses can lead to adhesion problems and to chipping of the coating.

To increase the residual compressive stresses in the hard material coating of a tool, especially in hard material coatings deposited in the CVD process, it is known to subject the tool to a mechanical surface treatment. Known mechanical treatment methods are the treatment by brushing and dry blasting or wet blasting. In the blasting treatment a fine grained blasting medium is directed onto the surface of the coating using compressed air under increased pressure. Such a surface treatment can reduce residual tensile stresses and increase residual compressive stresses in the outermost layer, but also in the layers of the hard material coating arranged thereunder.

Single-layer or multi-layer wear protective coatings of tools for the chip forming metal machining often comprise one or more polycrystalline TiAlN and/or TiAlCN layers having predominantly face-centered cubic crystal structure (fcc-TiAlN, fcc-TiAlCN). Especially fcc-TiAlN layers have proven of value for the wear protection of tools for multiple chip forming applications. Compared to the monometallic border systems of the hard material phases fcc-TiN, fcc-TiCN or AlN having hexagonal structure (w-AlN), fcc-TiAlN and fcc-TiAlCN layers are characterized by the advantageous combination of increased hardness and oxidation resistance. Fcc-TiAlN and fcc-TiAlCN layers are thermodynamically metastable. It is known that fcc-TiAlN deposited by PVD processes decomposes at increased temperature first by spinodal decomposition into Al-rich and Ti-rich domains of fcc-AlN and fcc-TiN, respectively. This goes along with an increase of the hardness and is known as "age hardening effect". When the temperature is further increased, the layer decomposes into the thermodynamically stable phases w-AlN (AlN having wurtzite structure) and fcc-TiN. For example, P. H. Mayrhofer et al., Applied Physics Letters, 83/10 (2003), pages 2049-2051, report about a spinodal decomposition of a $Ti_{0.5}Al_{0.5}N$ layer, which is deposited in the PVD process, at 860° C. beginning from the bulk of the coating material. The hardness of the coating decreases beginning at about 850° C., and above about 950° C. it is lower than in the non-annealed state. Adibi et al., J. Appl. Phys., 69/9 (1991), pages 6437-6450 report about the PVD deposition of $Ti_{0.5}Al_{0.5}N$ coatings, wherein a surface-initiated spinodal decomposition is observed in a temperature range of 540-560° C., and at a further increase of the temperature a phase separation into fcc-TiN and w-AlN is observed. Significant proportions of w-AlN phase, which is softer than fcc-TiAlN and fcc-TiN phases, lead to unfavorable mechanical and tribological properties of the coating. The phase conversion is promoted by stacking faults.

OBJECT OF THE INVENTION

The object of the present invention was to provide coated tools for the chip forming metal machining, particularly for turning and milling of steel or cast materials, which exhibit, compared to the prior art, improved wear resistance and improved comb crack resistance in dry machining, as well as under the use of coolant.

DESCRIPTION OF THE INVENTION

This object is solved by a tool having a base body of cemented carbide, cermet, ceramics, steel or high-speed steel and a single-layer or multi-layer wear protection coating deposited thereon in the CVD process and having a thickness within the range of from 2 µm to 25 µm, wherein the wear protection coating comprises at least a $Ti_{1-x}Al_xC_yN_z$ layer with $0.40 \leq x \leq 0.95$, $0 \leq y \leq 0.10$ and $0.85 \leq z \leq 1.15$ having a thickness in the range of from 1 µm to 16 µm and having >85 vol-% face-centered cubic (fcc) crystal structure, wherein the tool is characterized in that the $Ti_{1-x}Al_xC_yN_z$ layer comprises precipitations of $Ti_{1-o}Al_oC_pN_q$ at the grain boundaries of the $Ti_{1-x}Al_xC_yN_z$ crystallites having a higher Al content than inside the crystallites, wherein $0.95 \leq o \leq 1.00$, $0 \leq p \leq 0.10$, $0.85 \leq q \leq 1.15$ and $(o-x) \geq 0.05$.

A $Ti_{1-x}Al_xC_yN_z$ layer of the inventive stoichiometry, that is deposited in the CVD process on a substrate body, usually exhibits residual tensile stresses after its deposition, as it is the case in most of the hard material layers produced in the CVD process. Tools for the chip forming metal machining having such a layer in the wear protection coating are therefore subject to wear through crack formation, particularly comb crack formation. In the inventive tool, which is produced as it will subsequently be described, in the $Ti_{1-x}Al_xC_yN_z$ layer, because of the precipitations at the grain boundaries, there is generated a residual stress condition, advantageously residual compressive stresses, leading to an improvement of the wear resistance and crack resistance, especially comb crack resistance. This could be proved by experiments comparing coated tools having the same layer sequence and comprising a $Ti_{1-x}Al_xC_yN_z$ wear protection layer without or with the inventive precipitations at the grain boundaries. Compared to the comparative tools, in milling tests the inventive tools exhibited longer service lives, less comb crack formation and high thermal stability of the $Ti_{1-x}Al_xC_yN_z$ wear protection layer.

The inventive precipitations of $Ti_{1-o}Al_oC_pN_q$ having a higher Al content than inside the $Ti_{1-x}Al_xC_yN_z$ crystallites are generated during the production of the tool according to the inventive process, which will subsequently be described in more detail. Without being bound to a theory, the inventors assume that the precipitations of $Ti_{1-o}Al_oC_pN_q$ essentially consist of AlN having the hexagonal wurtzite structure (w-AlN), wherein the precipitations can contain low proportions of Ti and C. It is assumed that during the generation of the precipitations from the $Ti_{1-x}Al_xC_yN_z$ crystallites having face-centered cubic crystal structure a phase conversion into the hexagonal phase takes place. The hexagonal w-AlN phase could be verified in the precipitations. Furthermore, the analytical results suggest that there are epitaxial relationships between the w-AlN grain boundary precipitations and each of the adjacent fcc-$Ti_{1-x}Al_xC_yN_z$ crystallites. Because the hexagonal w-AlN phase has a higher volume than the face-centered cubic phase, the conversion apparently goes along with an expansion of the volume. It is therefore further assumed that this expansion of the volume at the grain boundaries of the $Ti_{1-x}Al_xC_yN_z$ crystallites leads to an increase of the residual compressive stress in the $Ti_{1-x}Al_xC_yN_z$ layer, which in turn results in an improvement of the wear resistance and the crack resistance, especially the comb crack resistance.

The average thickness of the $Ti_{1-o}Al_oC_pN_q$ precipitations lies, starting from the surface of the $Ti_{1-x}Al_xC_yN_z$ crystallites, in the range of about 4 nm to 200 nm, preferably 10 nm to 100 nm, particularly preferably 25 nm to 75 nm. If the average thickness of the $Ti_{1-o}Al_oC_pN_q$ precipitations is too low, the increase of the residual compressive stresses in the $Ti_{1-x}Al_xC_yN_z$ layer may be too low to achieve the herein described inventive advantages of improved wear resistance and crack resistance. If the $Ti_{1-o}Al_oC_pN_q$ precipitations have a too high thickness, then the total amount of precipitations is high. Because the precipitations contain a high proportion of hexagonal w-AlN, which is softer than the face-centered cubic $Ti_{1-x}Al_xC_yN_z$, a too high proportion of precipitations leads to an undesired decrease of the hardness of the layer and to impaired cutting properties.

The inventive precipitations can, for example, be shown in the scanning transmission electron microscope (STEM) on sufficiently thin electron-transparent polished cross-sections of the coatings, preferably through lamellae prepared by focused ion beam (FIB), and their thickness can be determined using the STEM images. Preferably, HAADF detectors (High Angle Annular Dark Field detectors) are used, and the precipitations are made visible in the inverse contrast of the BF-image (bright field) and the HAADF-image. Thereby, the $Ti_{1-o}Al_oC_pN_q$ precipitations having a higher Al content than inside the crystallites appear brighter than the $Ti_{1-x}Al_xC_yN_z$ crystallites in the BF-image, and in the HAADF-image the $Ti_{1-o}Al_oC_pN_q$ precipitations appear darker than the $Ti_{1-x}Al_xC_yN_z$ crystallites.

At a suitable sample thickness and orientation of the $Ti_{1-x}Al_xC_yN_z$ crystallite relative to the electron beam, by high-resolution transmission electron microscopy (HRTEM) one can obtain images from which diffraction images from the $Ti_{1-x}Al_xC_yN_z$ crystallite, as well as from regions of the $Ti_{1-o}Al_oC_pN_q$ excretion at the grain boundary can be derived by Fourier-transformation. By indexing of the diffraction images one can show that the face-centered cubic (fcc) phase is present in the $Ti_{1-x}Al_xC_yN_z$ crystallite, that the crystalline domains of the $Ti_{1-o}Al_oC_pN_q$ grain boundary precipitations have the w-AlN structure, and that there exist epitaxial relationships between the fcc $Ti_{1-x}Al_xC_yN_z$ crystallites and the w-AlN precipitation.

In an alternative, precipitations can be made visible in the scanning electron microscope (SEM) in embedded metallographic polished cross-sections or in samples polished parallel to the surface. Thereby, one takes advantage of the effect that in the final polishing step of the subsequently described preparation process w-AlN is stronger etched than the regions of cubic phases. Since the inventive precipitations contain a high proportion of hexagonal w-AlN, they are clearly visible in the prepared polished cross-sections.

For the preparation of a polished cross-section for the described analyses the produced tool is separated, embedded and then treated in the following manner: 6 min of grinding using a grinding wheel Struers Piano220 and water; 3 min of polishing using Struers 9 µm MD-Largo diamond suspension; 3:40 min of polishing using Struers 3 µm MD-Dac diamond suspension; 2 min of polishing using Struers 1 µm MD-Nap diamond suspension; at least 12 min of chemical polishing using Struers OP-S (suspension of colloidal silicone dioxide having an average particle size of 0.04 µm).

Prior to the subsequent SEM examination the samples are cleaned in an ultrasonic bath and de-magnetized. On the so produced polished cross-sections the inventive $Ti_{1-x}Al_xC_yN_z$ layers are imaged in the FE-SEM using a secondary electron detector at an accelerating voltage of 2.5 kV and typical working distances of 3-10 mm. Thereby, in the polished cross-section of the inventive samples there is observed the columnar structure of the $Ti_{1-x}Al_xC_yN_z$ layer, which in the non-annealed condition has about 100% face-centered cubic (fcc) structure. The inventive precipitations at the grain boundaries, that are etched stronger than the crystallites in the final step of chemical polishing in the above-described preparation, can be identified as darker regions due to the topography and the atomic number contrast. From the complementary XRD and EBSD results, as well as from comparative examinations on polished cross-sections of non-annealed $Ti_{1-x}Al_xC_yN_z$ layers and pure w-AlN layers one can conclude that the crystallites contain essentially 100% face-centered cubic phase, whereas the w-AlN phase proportions formed through the annealing are contained in the $Ti_{1-o}Al_oC_pN_q$ grain boundary precipitations, whereby it is supposed that the $Ti_{1-o}Al_oC_pN_q$ grain boundary precipitations predominantly consist of w-AlN. The determination of the broadness of the $Ti_{1-o}Al_oC_pN_q$ grain boundary precipitations and the determination of the minimum content of fcc phase in the inventive $Ti_{1-o}Al_xC_yN_z$ layer is generally possible on the so generated images by measuring the images or by the application of established image analysis procedures.

For the determination of the minimum content of fcc phase in the inventive $Ti_{1-x}Al_xC_yN_z$ layer EBSD measurements were carried out on the prepared polished cross-sections. For the examination of the layers produced in the examples a FE-SEM (Zeiss Supra 40 VP) with an EBSD detector (EDAX Digiview) was used. For the recording of the EBSD diffraction pattern, the electron beam was recorded in "High Current" mode in a hexagonal pattern applying sufficiently small increments (typically 0.03-0.04 μm; at least 5 times smaller than the average crystallite broadness evaluated from SEM images) at an accelerating voltage of 15 kV, 70° tilt and application of 60 μm or 120 μm apertures.

The data analysis of the EBSD maps using the OIM Analysis 7 software from Ametek EDAX was carried out as follows: In the first step, the EBSD map is cropped using the "crop" function in a way that only data points of the $Ti_{1-x}Al_xC_yN_z$ layer remain in the data set and that regions at the upper and lower borders, where due to the preparation process the polish is not plane, are also cropped. When applying the described preparation process, the remaining maps still represent at least 50%, usually >75% of the thickness of the $Ti_{1-x}Al_xC_yN_z$ layer. In the second step, a CI standardization ("grain CI standardization") is carried out applying a tolerance angle ("grain tolerance angle") of 5° and a minimum grain size of 5 data points. In the third step, partitioning of the so generated data set is carried out applying the filter CI>0.1, i.e. all data points that, after CI standardization, have a lower confidence index are disregarded.

On comparative samples of non-annealed $Ti_{1-x}Al_xC_yN_z$ layers, consisting essentially 100% of face-centered cubic (fcc) phase, i.e. wherein no signals of w-AlN are visible in the X-ray diffractogram and wherein in the SEM on a polished cross-section no etching effect resulting from the preparation is visible at the grain boundaries, by this type of EBSD measurement and analysis typically >95% of the data points of the cropped map are indexed as fcc phase, significantly less than 1% as w-AlN, and the rest with CI<0.1 is neglected. Since through the described complementary analysis procedures it was determined that the sample consists of approximately 100% fcc phase, one can conclude that the very low proportion of "w-AlN" data points must be a result of mis-indexing by the software. For the neglected data points with CI<0.1 one can assume that at these measurement points fcc phase is actually present. These data points predominantly lie at the grain boundaries where at lateral distances of the measurement point from the grain boundary below a few nm a superposition of diffraction images of adjacent grains can occur. In addition, through orientation-dependent etching there can occur height differences between adjacent grains. Both effects make that close to the grain boundaries diffraction images of relatively bad quality appear and that an indexing of the phase and orientation cannot securely be made by the software. Thus, the described method of the EBSD measurement does not provide information about the phase and orientation of those proportions of the $Ti_{1-x}Al_xC_yN_z$ layers that are at close range (distance of about ≤50 nm) to the grain boundaries, and phase and orientation of the inventive $Ti_{1-o}Al_oC_pN_q$ grain boundary precipitations are not detected because of the too low grain size and the morphology generated by the preparation. However, the method reliably detects the face-centered cubic (fcc) phase present in the crystallites of the $Ti_{1-x}Al_xC_yN_z$ layer and thus provides a value of the minimum content of fcc phase in the $Ti_{1-x}Al_xC_yN_z$ layer. Thereby, for non-annealed $Ti_{1-x}Al_xC_yN_z$ layers having an actual content of about 100% fcc phase, typical values of >95% area proportion of fcc phase are obtained. An annealed sample having $Ti_{1-o}Al_oC_pN_q$ grain boundary precipitations the minimum proportions of the fcc phase determined by EBSD are to some percent lower, and from the difference compared to the measured minimum proportion of fcc phase in the non-annealed comparative sample one can estimate the volume proportion of the formed grain boundary precipitations. The measurement results of the produced coatings of the examples, as listed in table 4, show that the $Ti_{1-o}Al_oC_pN_q$ grain boundary precipitations in the inventive $Ti_{1-x}Al_xC_yN_z$ layers make up a volume proportion of below 10%.

The thickness or the volume proportion, respectively, of the inventive precipitations can be varied during the preparation of the inventive $Ti_{1-x}Al_xC_yN_z$ layer, especially by the duration and temperature of the annealing, according to the process for the preparation of the inventive tool, as it will subsequently be described in detail. The skilled person can, if he knows the present invention, determine the suitable parameters of duration and temperature within the inventive ranges for a desired precipitation thickness or precipitation volume proportions, respectively, by only a few experiments.

The inventive $Ti_{1-x}Al_xC_yN_z$ layer has predominantly face-centered cubic (fcc) crystal structure. However, proportions of softer other phases, such as for example hexagonal AlN, can be present in the layer, which, however, are undesired if they are formed by co-deposition together with the fcc-$Ti_{1-x}Al_xC_yN_z$ structure, because they disadvantageously influence the hardness and the wear resistance. It is therefore preferred if the $Ti_{1-x}Al_xC_yN_z$ layer of the inventive tool (total layer including the volume proportions of the w-AlN precipitations at the grain boundaries) comprises at least 90 vol. %, preferably at least 95 vol %, particularly preferably at least 98 vol % of face-centered cubic (fcc) crystal structure. The higher the proportion of face-centered cubic (fcc) crystal structure is in the $Ti_{1-x}Al_xC_yN_z$ layer, the higher is the wear resistance. The experiments carried out in the context with this invention allow for the conclusion that already at very low proportions of the w-AlN precipitations in the layer material the advantageous inventive properties with respect to hardness, residual stress and wear resistance are obtained.

In another preferred embodiment of the invention, the $Ti_{1-x}Al_xC_yN_z$ layer has a columnar microstructure. Polycrystalline hard material layers of TiAlCN and/or TiAlN produced in the CVD process can, except for columnar microstructure, also exhibit rather equiaxed microstructures. The $Ti_{1-x}Al_xC_yN_z$ layer having columnar microstructure has the advantage that during the formation of $Ti_{1-o}Al_oC_pN_q$ grain boundary precipitations, which goes along with volume expansion, a plane compression tensioning of the $Ti_{1-x}Al_xC_yN_z$ crystallites is effected parallel to the substrate, and thus, a higher change of the residual stress with respect to the volume proportion of w-AlN than in an equiaxed structure is achieved. In addition, in equiaxed structures, in general, less pronounced growth textures than in columnar structures are formed so that a {111} fibre texture, which is desired according to a preferred embodiment of the invention, cannot form.

In another preferred embodiment of the invention, the $Ti_{1-x}Al_xC_yN_z$ layer has stoichiometric coefficients of 0.60≤x≤0.90, y=0 and 0.85≤z≤1.15. In this embodiment, the $Ti_{1-x}Al_xC_yN_z$ layer comprises essentially no carbide carbon, except for unavoidable impurities and/or impurities conditional of manufacturing. This essentially pure nitride layer has the advantage of a simpler process control during the CVD coating. Furthermore, a more homogenous control of the layer properties and the layer composition within one coating batch is facilitated. Further, for TiAlCN layers one has to consider that only limited amounts of carbon dissolve in the lattice of the cubic phase, and excess carbon can be present in amorphous form, which can result in a lower hardness of the layer and in disadvantageous tribologic properties that can have a disadvantageous effect on the service life of the tool.

In another preferred embodiment of the inventive tool, the $Ti_{1-x}Al_xC_yN_z$ layer has a Vickers hardness (HV) of more than 2700 HV, preferably more than 3000 HV, particular preferably more than 3200 HV. A too low Vickers hardness has the disadvantage of unfavorable cutting properties and too low wear resistance. The high Vickers hardness is achieved by the application of the inventive process for the production of the tool that will subsequently be described in more detail. If during the annealing of the $Ti_{1-x}Al_xC_yN_z$ layer a too high temperature and/or a too long time of annealing is applied, the Vickers hardness of the $Ti_{1-x}Al_xC_yN_z$ layer can drop significantly below 2500 HV, whereby the tool becomes unsuitable for particular applications, and the wear resistance drops. At temperatures above 950° C. the inventors have generally observed a significant decrease of the hardness. The temperatures and/or duration required to achieve the inventive properties will, depending on the characteristic of the layer structure, for example at different grain sizes and grain morphologies, be different, but they can be determined by the skilled person by simple series of experiments. The Vickers hardness indications in the context of the present invention relate to an applied test load of 25 mN.

In another preferred embodiment of the inventive tool the $Ti_{1-x}Al_xC_yN_z$ layer has a preferred orientation of the crystal growth with respect to the crystallographic {111} plane. This is characterized by a texture coefficient TC (111)>1.5, preferably >2, particularly preferably >3. The texture coefficient TC (111) is defined by the Harris formula:

$$TC(111) = \frac{I(111)}{I_0(111)} \left[ \frac{1}{n} \sum_{n=1}^{n} \frac{I(hkl)}{I_0(hkl)} \right]^{-1},$$

wherein

I(hkl) are the intensities of the diffraction reflections measured by X-ray diffraction, $I_0$(hkl) are the standard intensities of the diffraction reflections according to the pdf card 00-046-1200, n is the number of reflections used in the calculation, and for the calculation of TC(111) the reflections (111), (200), (220) and (311) are used.

A preferred orientation of the crystal growth of the inventive $Ti_{1-x}Al_xC_yN_z$ layer having a texture coefficient TC (111)>1.5, preferably >2, particularly preferably >3, has turned out to be particularly advantageous. Compared to $Ti_{1-x}Al_xC_yN_z$ layers of other preferred orientations, a significantly longer service life is observed. The reason for that is not clear, however, it can be supposed that through the presence of {111} crystal planes, which are the sliding planes in the face-centered cubic crystal lattice, and the thereby provided deformability parallel to the coating surface, a more homogenous and, compared to other preferred orientations, lower wear is achieved. A comparable effect is known from α-aluminum oxide layers wherein the highest wear resistance is observed at the presence of a {001} preferred orientation and the advantageous orientation of the {001} sliding planes in the rhombohedral crystal going along therewith (S. Ruppi, Surface & Coatings Technology, 202 (2008), pages 4257-4269). Similar to the known α-aluminum oxide layers, also for the inventive $Ti_{1-x}Al_xC_yN_z$ coatings it is observed that this effect is not significant for very weak textures having TC(111)<1.5, and it is only significantly pronounced at higher preferred orientations with TC(111)>2, and that for very pronounced texture with TC(111)>3 an even more significant increase of the service life is achieved.

In another preferred embodiment of the invention the $Ti_{1-x}Al_xC_yN_z$ layer has a preferred orientation of the crystal growth with respect to the crystallographic {111} plane which is characterized in that the maximum of the X-ray diffraction peak of the crystallographic {111} plane, measured by X-ray diffraction (XRD) and/or by electron back scattering (EBSD), is measured within an angle α=±20 degrees, preferably within an angle α=±10 degrees, particularly preferably within an angle α=±5 degrees, more particularly preferably within an angle α=±1 degrees relative to the normal to the surface of the base body. Relevant herein is the section through the pole figure of the {111} plane of the fcc-$Ti_{1-x}Al_xC_yN_z$ after the integration of the intensities across the azimuth angle β (rotational angle around the normal of the sample surface).

In another preferred embodiment of the invention the half width (FWHM) of the X-ray diffraction peak of the crystallographic {111} plane is <1° 2θ, preferably <0.6° 2θ, particularly preferably <0.45° 2θ. A too high half width (FWHM) of the X-ray diffraction peak of the {111} plane of the $Ti_{1-x}Al_xC_yN_z$ is an indication of lower grain sizes of the face-centered cubic (fcc) phase or even of proportions of amorphous phases. In the tests carried out so far this has shown to be disadvantageous for the wear resistance.

In another embodiment of the inventive tool the $Ti_{1-x}Al_xC_yN_z$ layer has a lamellar structure having lamellae with a thickness of not more than 150 nm, preferably not more than 100 nm, particularly preferably not more than 50 nm, wherein the lamellae are formed from periodically alternating regions of the $Ti_{1-x}Al_xC_yN_z$ layer having alternatingly different stoichiometric contents of Ti and Al and having the same crystal structure (=crystallographic phase) and/or the same crystallographic orientation.

It has surprisingly been found that the inventive lamellar structure, as defined above, provides for good service lives of the tool in cutting operations. The service lives are also significantly higher than for lamellar TiAlN or TiAlCN structures that are known from the prior art and having alternating crystal structures, namely alternating face-centered cubic and hexagonal crystal structures of the lamellae.

In another preferred embodiment of the inventive tool the $Ti_{1-x}Al_xC_yN_z$ layer has residual compressive stresses, preferably within the range of from <0 MPa to −5000 MPa, particularly preferably within the range of from −300 MPa to −3500 MPa, measured on the {222} reflection at 81.5-82 degrees 2-theta of the fcc-$Ti_{1-x}Al_xC_yN_z$ phase by the $sin^2 \psi$ method.

By residual compressive stresses in the $Ti_{1-x}Al_xC_yN_z$ layer the resistance against crack formation, especially comb crack formation, and thus the wear resistance of the tool is improved. Too high residual compressive stresses in the $Ti_{1-x}Al_xC_yN_z$ layer can, however, lead to adhesion problems and chipping of the layer.

In another preferred embodiment of the invention between the base body and the $Ti_{1-x}Al_xC_yN_z$ layer there is provided at least one further hard material layer with a thickness of from 0.05 μm to 7 μm, preferably of from 0.1 μm to 5 μm, particularly preferably of from 0.2 μm to 3 μm, selected from a TiN layer, a TiCN layer deposited by high-temperature CVD or moderate-temperature CVD (MT-CVD), a $Al_2O_3$ layer, a h-AlN layer and combinations thereof.

Furthermore, it is preferred if above the $Ti_{1-x}Al_xC_yN_z$ layer there is provided at least one further hard material layer, preferably selected from $\alpha$-$Al_2O_3$, $\kappa$-$Al_2O_3$, $\gamma$-$Al_2O_3$, TiN, MT-TiCN, h-AlN and combinations thereof. Particularly preferred is a $\alpha$-$Al_2O_3$ layer, wherein the $Al_2O_3$ layer is deposited by high-temperature CVD (CVD) or moderate-temperature CVD (MT-CVD).

The invention also relates to a process for the production of the herein described inventive tool having a base body of cemented carbide, cermet, ceramics, steel or high-speed steel and a single-layer or multi-layer wear protection coating deposited thereon by the CVD process and having a thickness within the range of from 2 μm to 25 μm, wherein the process comprises the following steps:

deposition of a $Ti_{1-x}Al_xC_yN_z$ layer with $0.40 \leq x \leq 0.95$, $0 \leq y \leq 0.10$ and $0.85 \leq z \leq 1.15$ having a thickness within the range of from 1 μm-16 μm in the CVD process at a process temperature within the range of from 625 to 800° C., annealing of the deposited $Ti_{1-x}Al_xC_yN_z$ layer at a temperature within the range of from 700-950° C. for a duration of from 0.5-12 hours under exclusion of air, wherein the conditions are selected in a way that at the grain boundaries of the $Ti_{1-x}Al_xC_yN_z$ crystallites precipitations of $Ti_{1-o}Al_oC_pN_q$ are generated having a higher Al content than inside the crystallites and with $0.95 \leq o \leq 1.00$, $0 \leq p \leq 0.10$, $0.85 \leq q \leq 1.15$ and $(o-x) \geq 0.05$.

Figure 1:
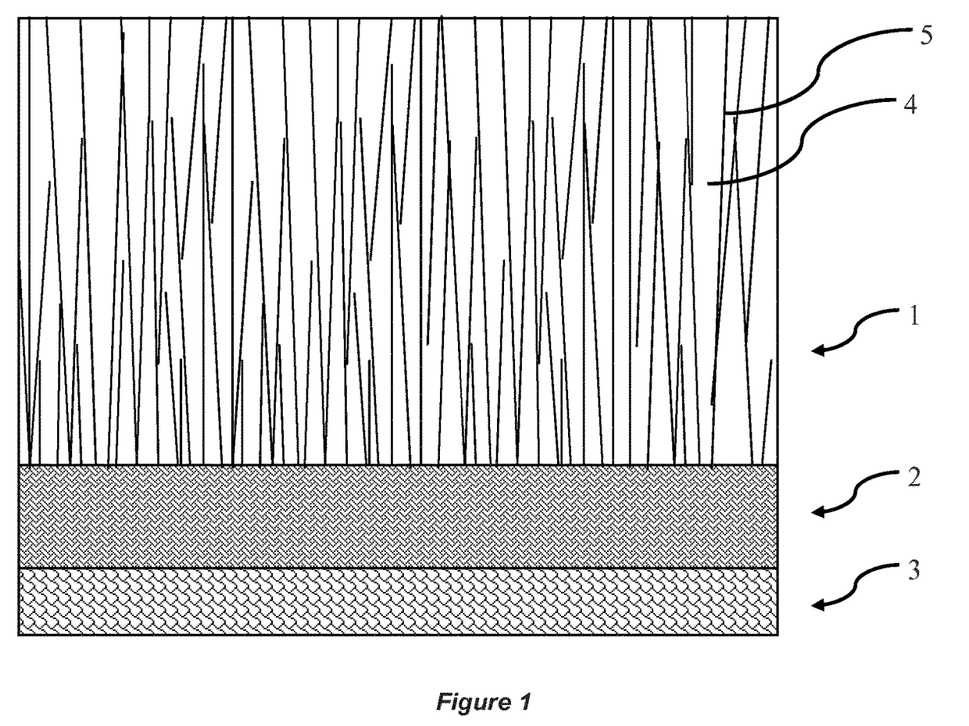
Figure 2:
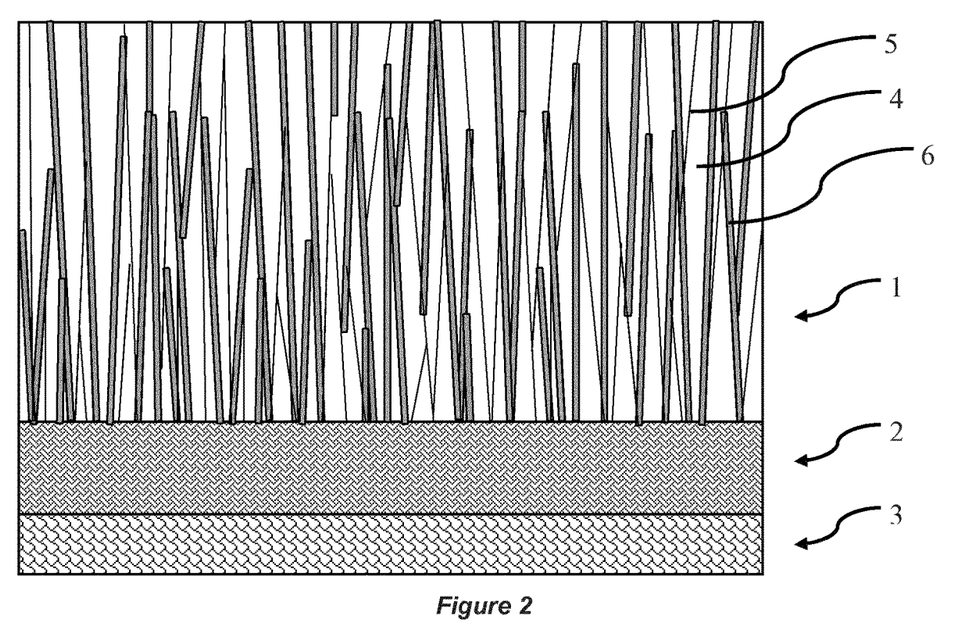
FIG. 2 shows a schematic representation of an inventive hard material coating similar to FIG. 1, but with inventive precipitations 6 of Ti$_{1-o}$Al$_o$C$_p$N$_q$ at the grain boundaries 5 of the crystallites 4, as they are formed by the annealing step in the inventive process. The precipitations of Ti$_{1-x}$Al$_o$C$_p$N$_q$ have a higher AlN content than inside the Ti$_{1-x}$Al$_x$C$_y$N$_z$ crystallites.
Figure 3:
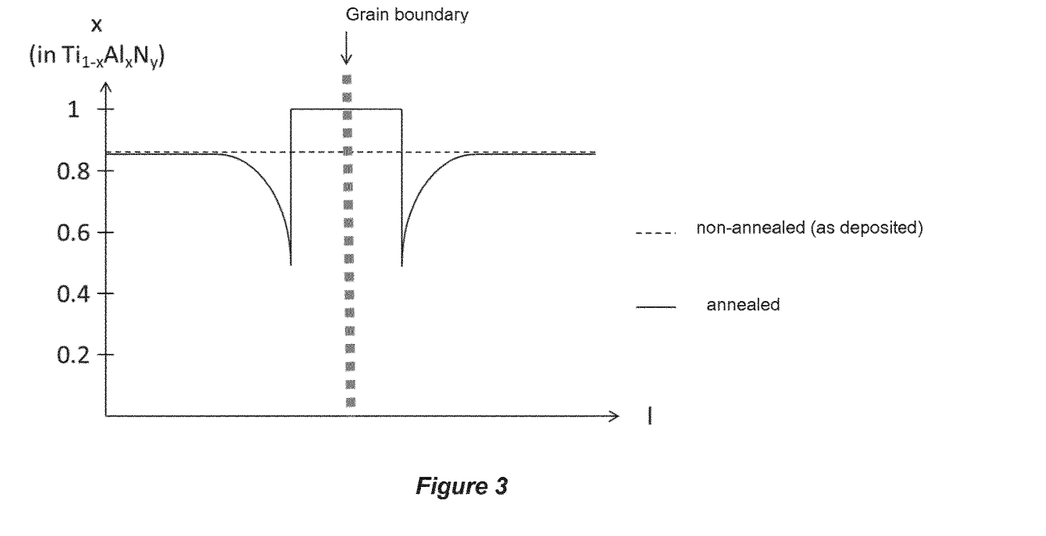
FIG. 3 schematically shows a concentration profile of the stoichiometric Al proportion (x) in the Ti$_{1-x}$Al$_x$C$_y$N$_z$ layer across a grain boundary of two adjacent crystallites. In the non-annealed material according to the prior art (dashed line) the stoichiometrical Al proportion (x) inside the adjacent Ti$_{1-x}$Al$_x$C$_y$N$_z$ crystallites to the grain boundary is constant. In contrast to that, in the material annealed according to the invention (non-dashed line) the stoichiometrical Al proportion (x), starting from the inside of the adjacent Ti$_{1-x}$Al$_x$C$_y$N$_z$ crystallites to the grain boundary, first decreases, but then it significantly increases at the grain boundary to above the Al proportion inside the adjacent Ti$_{1-x}$Al$_x$C$_y$N$_z$ crystallites. These are inventive precipitations at the grain boundaries.
Figure 4:
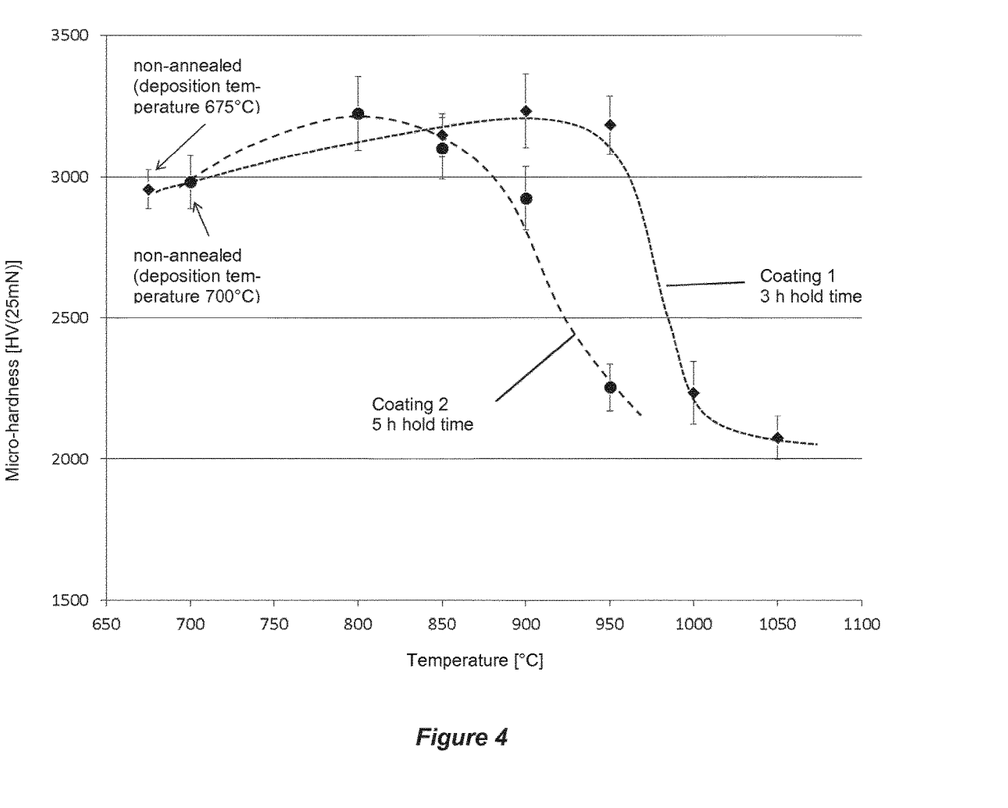
FIG. 4 shows the measured values of the micro-hardnesses of the non-annealed Ti$_{1-x}$Al$_x$C$_y$N$_z$ layers and the Ti$_{1-x}$Al$_x$C$_y$N$_z$ layers annealed at different temperatures and for durations of 3 h (coating 1) and 5 h (coating 2), respectively, on the tools 1 to 11 of example 1 described below. The values shown above the temperature value of 675° C. (coating 1) and 700° C. (coating 2), respectively, and designated "non-annealed" are to be assigned to the non-annealed tools. The temperature of 675° C. (coating 1) and 700° C. (coating 2), respectively, corresponds to the deposition temperature. One can clearly see the abrupt drop of the hardness at annealing temperatures above 950° C., namely at 1000° C. and 1050° C. at a holding time of 3 h. At the longer holding time of 5 h, the significant drop of hardness begins already at lower temperatures, namely at 950° C. Compared to the non-annealed comparative tool, the increase of the hardness was low at both holding times, however, the tools annealed according to the invention achieved significantly bet-ter results in the wear tests.

Particularly preferably the conditions of temperature and duration during annealing are selected or coordinated, respectively, in a way that after annealing the $Ti_{1-x}Al_xC_yN_z$ layer has a Vickers hardness (HV) of more than 2700 HV, preferably more than 3000 HV, particularly preferably more than 3200 HV. The advantages of the respective hardnesses have been described above. Temperature and duration during annealing are selected in a way that not too much of hexagonal AlN phase is precipitated and the hardness of the $Ti_{1-x}Al_xC_yN_z$ layer does not drop below the preferred values. Therefore, at high temperatures, a shorter duration of annealing has to be selected, and vice versa. Being aware of the present invention, the skilled person can determine the optimum parameters by simple experiments. The enclosed FIG. 4 shows examples of the development of hardness at different annealing temperatures and different durations, herein 3 h or 5 h, respectively.

In another preferred embodiment of the inventive process the conditions of temperature and duration during annealing are selected in a way that the remaining content of face-centered cubic (fcc) crystal structure in the $Ti_{1-x}Al_xC_yN_z$ layer, after the generation of the precipitations of $Ti_{1-o}Al_oC_pN_q$ in the $Ti_{1-x}Al_xC_yN_z$ layer after the annealing, is >85 vol %.

As already discussed, a $Ti_{1-x}Al_xC_yN_z$ layer deposited in the CVD process on a substrate body and having the stoichiometry according to the invention, after the deposition, in general, has residual tensile stresses exhibiting the known disadvantages of wear by crack formation, particularly comb crack formation, in the chip forming metal machining.

In the inventive process, after the as such known deposition of the $Ti_{1-x}Al_xC_yN_z$ layer, there follows an annealing treatment wherein the inventive precipitations are generated. Thereby, it is essential that the annealing is carried out at a temperature within the range of from 700-950° for a duration of 0.5-12 hours under exclusion of air or oxygen, respectively.

The annealing can be carried out after the deposition of the $Ti_{1-x}Al_xC_yN_z$ layer and of the optional further layers of the coating in a separate process and/or in a different reactor than the deposition of the hard material layers. But the annealing can also be carried out immediately following the deposition of the $Ti_{1-x}Al_xC_yN_z$ layer in the same reactor. It can, for example, be a part of the subsequent deposition of one or more further hard material layers above the $Ti_{1-x}Al_xC_yN_z$ layer by CVD. Thereby, it has to be considered that the subsequent deposition process or processes is/are carried out at temperatures and for durations below the upper limits defined herein for the inventive process. Thermal CVD processes using temperatures above 950° C. are therefore not suitable, whereas, for example, MT-CVD processes are generally carried out at about 700-900° C. and are thus within the temperature range of the inventive process. It has surprisingly turned out that tools of the inventive type exhibit significantly higher wear resistance, especially resistance against flank wear, as well as significantly higher resistance against crack formation, especially comb crack formation, than non-annealed tools and than tools that are annealed out-side the process parameters that are essential to the present invention, especially at too high temperature. Therefore, according to the invention it is particularly advantageous if the herein described process parameters during annealing are observed and adjusted in a way that the remaining content of face-centered cubic (fcc) crystal structure in the $Ti_{1-x}Al_xC_yN_z$ layer is at least 85 vol %.

In another preferred embodiment of the inventive process the annealing of the deposited $Ti_{1-x}Al_xC_yN_z$ layer is carried out at a temperature within the range of from 750-900° C., preferably 800-850° C. and/or for a duration of from 1-6 hours.

An essential process condition is also the exclusion of air, because otherwise the $Ti_{1-x}Al_xC_yN_z$ layer may oxidize. The process can, for example, be carried out under vacuum or protective gas atmosphere, such as argon, hydrogen or nitrogen.

The precipitations formed in the inventive process at the grain boundaries generate in the $Ti_{1-x} Al_xC_yN_z$ layer a residual stress condition, advantageously residual compressive stresses, resulting in an improvement of the wear resistance and resistance against crack formation, especially resistance against comb crack formation.

It is self-evident that the skilled person will optimize the properties of the tool produced according to the process of the invention by variation of the process parameters within the ranges indicated herein as being in accordance with the invention. High temperatures during annealing can require shorter annealing durations than lower temperatures. The optimum parameters within the inventive ranges can, however, be determined by the skilled person by only a few experiments and under consideration of the examples described below. Particularly, the skilled person will observe the amounts and thicknesses of the precipitations formed during annealing, and he will correspondingly adapt the tool to the demands made, since each operation in metal machining puts different demands on the tool properties.

Preferably, the inventive CVD process for the deposition of the $Ti_{1-x}Al_xC_yN_z$ layer is a LP-CVD process (low pressure CVD process), which is carried out at a process pressure within the CVD reactor within the range of from 0.05 to 8 kPa, preferably within the range of from 0.1 to 7 kPa, particularly preferably within the range of from 0.3 to 2 kPa. At higher process pressures, generally, no $Ti_{1-x}Al_xC_yN_z$ layers having face-centered cubic and columnar structure are achieved, but rather layers with significant proportions of w-AlN. Lower process pressures require a significantly higher technical effort for the generation of vacuum, and in addition, coating processes at lower pressures have a lower throwing power for an even distribution of the coating thicknesses across complex shaped parts.

DEFINITIONS AND METHODS

Scanning Electron Microscopy (SEM):

For scanning electron microscopy images a Supra 40 VP electron microscope with a field emission cathode from Carl Zeiss was used. The imaging conditions to find and characterize the inventive grain boundary precipitations are described above.

Electron Backscatter Diffraction (EBSD):

EBSD analysis was performed using a Digiview IV detector from Ametek EDAX in a Supra 40 VP FE-SEM from Carl Zeiss. The recoding conditions and the evaluation processes for EBSD are described above in more detail.

Transmission Electron Microscopy (TEM):

A transmission electron microscope FEI Titan 80-300 with field emission cathode at an acceleration voltage of 300 kV was used. Scanning transmission electron microscope images were taken using Bright Field (BF; Bright Field) and High Angle Annular Dark Field-(HAADF) detectors. For the preparation of samples for the transmission electron microscopy a combined FIB/SEM system was used (FIB=Focused Ion Beam) equipped with a liquid-gallium ion source or a field emission cathode as electron source, as well as with a system for ion- and electron-aided deposition of Pt. With the aid of this system polished cross-sections were prepared from the layer as lamellae using In-Situ Lift-Out and thinned to sufficient electron transparency.

Electron Dispersive X-Ray Spectroscopy (EDX):

EDX measurements were carried out on a scanning electron microscope Supra 40 VP from Carl Zeiss at 15 kV acceleration voltage with an EDX spectrometer of the type INCA x-act from Oxford Instruments, UK. For the EDX measurements on the transmission electron microscope Titan 80-300 80-300 TEM/STEM there was also used an Inca EDX System from Oxford Instruments, UK.

X-Ray Diffraction (XRD):

X-ray diffraction measurements were done on a diffractometer of the type GE Sensing & Inspection Technologies PTS3003 using CuK$\alpha$-radiation. For $\theta$-2$\theta$-scans, for the residual stress and pole figure measurements a parallel beam optics was used consisting on the primary side of a polycapillary and a 2 mm pinhole as collimator. On the secondary side a parallel plate collimator with a divergence of 0.4° and a nickel $K_\beta$ filter was used.

Peak intensities and half widths were determined from $\theta$-2$\theta$ measurements. After background subtraction, pseudo-Voigt-functions were fitted to the measurement data, whereby the K$\alpha_2$-subtraction was carried out by K$\alpha_1$/K$\alpha_2$-doublet fitting. Peak intensities and half widths relate to the thus fitted K$\alpha_1$ interferences. The lattice constants were calculated according to Vergard's law using the lattice constants of TiN and AlN from the pdf cards 38-1420 and 00-046-1200, respectively.

In the X-ray diffraction the {101} or {202} interferences of hexagonal AlN and the {111} or {222} reflection, respectively, of cubic $Ti_{1-x}Al_xC_yN_z$ can superimpose in a more or less pronounced manner depending on the chemical composition. Only the interference of the {200} plane of the cubic $Ti_{1-x}Al_xC_yN_z$ is not superimposed by any further interference, such as for example from the substrate body or any layers arranged above or below, and for random orientation it has the highest intensity.

For the evaluation of the volume proportions of hexagonal AlN in the measured volume and for avoiding misinterpretations with respect to the {111} and {200} intensities of the cubic $Ti_{1-x}Al_xC_yN_z$ the measurements ($\theta$-2$\theta$-scans) were carried out under two different tilt angles $\psi$ ($\psi=0°$ and $\psi=54.74°$). Because the angle between the normals of the planes of {111} and {200} is about 54.74°, a strong {111} fibre texture results in an intensity maximum of the {200} reflection at a tilt angle $\psi=54.74°$, whereas the intensity of the {111} reflection approximates to zero. Vice versa, at a tilt angle $\psi=54.74°$ a strong intensity maximum of the {111} reflection is obtained at a strong {200} fibre texture, whereas the intensity of the {200} reflection approximates to zero.

In this way, for the produced $Ti_{1-x}Al_xC_yN_z$ layers it was checked whether the measured intensities at $2\theta \approx 38.1°$ can predominantly be assigned to the face-centered cubic $Ti_{1-x}Al_xC_yN_z$ phase. Both X-ray diffraction as well as EBSD measurements consistently showed only very few proportions of hexagonal AlN phase in the non-annealed $Ti_{1-x}Al_xC_yN_z$ layers.

Pole Figures:

Pole figures of the {111} reflection were prepared by XRD using the described optics at $2\theta=38.0°$ over an angle range of $0° \leq \alpha \leq 75°$ (increment 5°) and $0° \leq \beta \leq 360°$ (increment 5°) with a circular arrangement of the measurement points. The intensity distribution of all measured and back-calculated pole figures was approximately rotationally symmetrical, i.e. the investigated layers exhibited fibre texture. For checking the preferential orientation, in addition to the {111} pole figure, pole figures were measured on the {200} and {220} reflections. The orientation density distribution function (ODF) was calculated using the software Labo-Tex3.0 from LaboSoft, Poland, and the preferential orientation was represented by an inverse pole figure. In the inventive coatings the intensity maximum was in the crystallographic direction <111>, corresponding to the set preferential orientation or within an angle deviation of $\leq 20°$ from <111>.

Residual Stress Measurements:

For the analysis of residual stresses the {222} interference of the face-centered cubic $Ti_{1-x}Al_xC_yN_z$ layer was measured according to the $\sin^2 \psi$ method applying 25 $\psi$ angles from −60° to +60° (increment 5°) using the diffractometer GE Sensing & Inspection Technologies PTS3003 with the above-described measurement optics. After background subtraction, Lorentz-polarization correction and K$\alpha_2$ subtraction (Rachinger separation), the positions of the lines of the interferences were determined by fitting of the profile functions to the measured data. The applied elastic constants were ½s$_2$=1.93 TPa$^{-1}$ and s$_1$=−0.18 TPa$^{-1}$. Residual stresses are generally indicated in the unit Megapascal (MPa), whereby residual tensile stresses are designated by a positive algebraic sign (+) and residual compressive stresses are designated by a negative algebraic sign (−).

Characterization of Lamellar Structures in Ti$_{1-x}$Al$_x$C$_y$N$_z$ Layers:

The confirmation and characterization of the presence of lamellar structures in the inventive Ti$_{1-x}$Al$_x$C$_y$N$_z$ layers by X-ray diffraction (XRD) and by conventional as well as high resolution transmission electron microscopy (TEM and HR-TEM) was carried out as described by J. Keckes et al., "Self-organized periodic soft-hard nanolamellae in polycrystalline TiAlN thin films", Thin Solid Films 545 (2013), pages 29-32.

Determination of Micro-Hardness (Vickers Hardness) and Modulus of Indentation (E$_{IT}$):

The measurements of micro-hardness and of the modulus of indentation were carried out according to DIN EN ISO 14577 using a universal hardness tester, Fischerscope H100, from Helmut Fischer GmbH, Sindelfingen, Germany, on a polished cross-section of the coated body. The measurements of the micro-hardness were carried out applying a test load of 25 mN.

The invention will now be further described by non-limiting examples and the description of the enclosed figures.

FIGURES

FIG. 1 shows a schematic representation of a hard material coating on a tool substrate 3 in cross-section. On the substrate 3 there is first provided a coating layer 2 deposited in the CVD process, which can for example be an adhesion layer of TiN. Above the coating layer 2 there is provided a non-annealed Ti$_{1-x}$Al$_x$C$_y$N$_z$ layer 1 without inventive precipitations, as it is known from the prior art or as it can look like in the inventive process prior to the annealing. The Ti$_{1-x}$Al$_x$C$_y$N$_z$ layer 1 has a columnar structure with crystallites 4 and grain boundaries 5.

EXAMPLES

Example 1: Preparation of Coated Cemented Carbide Indexable Cutting Inserts and Analysis As substrate bodies in these examples cemented carbide indexable cutting inserts of the geometry SEHW1204AFN having a composition of 90.5 wt-% WC, 8 wt-% Co and 1.5 wt-% (NbC+TaC) were used.

For the coating of the cemented carbide indexable cutting inserts a CVD coating reactor of the type Bernex BPX325S with a reactor height of 1250 mm, a reactor diameter of 325 mm and a volume of the charge arrangement of 40 liters was used. The gas flow was radially with respect to the longitudinal axis of the reactor.

For the adhesion of the inventive Ti$_{1-x}$Al$_x$C$_y$N$_z$ layer, as well as of the comparative layers, immediately on the cemented carbide substrate there was first deposited an about 0.3 μm thick TiN layer by CVD under the deposition conditions indicated in table 1:

TABLE 1

| Reaction conditions for the preparation of the adhesion layer | | | | | | |
|---|---|---|---|---|---|---|
| Adhesion | Temp. | Pressure | Time | Reaction gas mixture [vol-%] | | |
| Layer | [° C.] | [kPA] | [min] | TiCl$_4$ | N$_2$ | H$_2$ |
| TiN | 850 | 15 | 90 | 1.0 | 44.0 | 55.0 |

For the preparation of the Ti$_{1-x}$Al$_x$C$_y$N$_z$ layer a first precursor gas mixture (VG1) containing the starting compounds TiCl$_4$ and AlCl$_3$ and a second precursor gas mixture (VG2) containing the starting component NH$_3$ as reactive nitrogen component were introduced into the reactor separately so that a blending of the two gas streams took place not earlier than at the entry into the reaction zone. The volume gas streams of the precursor gas mixtures (VG1) and (VG2) were set in a manner that a mean retention time τ of the reaction gases in the reactor and a total volume stream under normal conditions $\dot{V}_N$ was achieved. The parameters of the preparation of the Ti$_{1-x}$Al$_x$C$_y$N$_z$ layer are indicated in table 2. The thickness of the Ti$_{1-x}$Al$_x$C$_y$N$_z$ layer was about 8 μm for coating #1 and about 6 μm for coating #2.

TABLE 2

Reaction conditions at the preparation of $Ti_{1-x}Al_xC_yN_z$ coatings

| $Ti_{1-x}Al_xC_yN_z$ Coating # | Temp. [° C.] | Pressure [kPa] | Time [min] | Total volume stream $V_N$ [l$_N$/min] | τ [sec] | Precursor gas mixture (VG1) | | | Precursor gas mixture (VG2) | |
|---|---|---|---|---|---|---|---|---|---|---|
| | | | | | | $TiCl_4$ | $AlCl_3$ | $H_2$ | $H_2$ | $NH_3$ |
| 1 | 675 | 0.38 | 150 | 92 | 0.10 | 0.03 | 0.23 | 49.5 | 49.2 | 1.09 |
| 2 | 700 | 0.70 | 120 | 106 | 0.16 | 0.02 | 0.17 | 52.7 | 46.8 | 0.35 |

After the coating, the prepared indexable cutting inserts were subjected to different temperature treatments. The temperature conditions are indicated in the following table 3.

TABLE 3

Temperature conditions

| Tool # | Coating # | Time [h] | Temperature [° C.] | Atmosphere |
|---|---|---|---|---|
| 1 | 1 | — | — | — |
| 2 | 1 | 3 h | 850° C. | vacuum |
| 3 | 1 | 3 h | 900° C. | vacuum |
| 4 | 1 | 3 h | 950° C. | vacuum |
| 5 | 1 | 3 h | 1000° C. | vacuum |
| 6 | 1 | 3 h | 1050° C. | vacuum |
| 7 | 2 | — | — | — |
| 8 | 2 | 5 h | 800° C. | vacuum |
| 9 | 2 | 5 h | 850° C. | vacuum |
| 10 | 2 | 5 h | 900° C. | vacuum |
| 11 | 2 | 5 h | 950° C. | vacuum |

For the characterization of the $Ti_{1-x}Al_xC_yN_z$ layer there were applied X-ray diffraction (XRD), electron diffraction, especially EBSD, scanning electron microscopy (SEM), scanning transmission electron microscopy (STEM) and transmission electron microscopy (TEM), as well as measurements of the micro-hardness.

also using scanning transmission electron microscopy (STEM) and transmission electron microscopy (TEM). Thereby, in the STEM images $Ti_{1-o}Al_oC_pN_q$ precipitations were visible at the grain boundaries, which appeared brighter than the $Ti_{1-x}Al_xC_yN_z$ crystallites in the BF image due to the higher Al content, and in the HAADF image the $Ti_{1-o}Al_oC_pN_q$ precipitations appeared darker than the $Ti_{1-x}Al_xC_yN_z$ crystallites. By HRTEM and Fourier-transformation on the $Ti_{1-x}Al_xC_yN_z$ crystallite the presence of face-centered cubic (fcc) phase in the crystallite, an epitaxial relationship to the crystalline domains in the $Ti_{1-o}Al_oC_pN_q$ precipitation at an adjacent grain boundary, and the presence of w-AlN phase in the $Ti_{1-o}Al_oC_pN_q$ precipitation could be proved. The thickness of the precipitation having w-AlN structure was about 25 nm.

Furthermore, in some crystallites lamellar structures were visible in STEM images. The sharp-ness of the observed bright/dark-contrast, and thus the visibility of the lamellar structure, depends on the orientation of the crystallite relative to the electron beam. The lamellar structure of the inventive $Ti_{1-x}Al_xC_yN_z$ layers is characterized by inverse bright/dark-contrasts in the imaging modes bright field (BF) and "high angle annular dark field" (HAADF). This contrast inversion is an indication of different chemical compositions of the bright and dark regions of the lamellar structure. The regions appearing bright and dark have generally different thicknesses. By EDS analysis it could be shown that the

TABLE 4

Results of the parameter measurements on the $Ti_{1-x}Al_xC_yN_z$ layer

| Example # | Composition $Ti_{1-x}Al_xC_yN_z$ [x, y, z] | | | Vickers hardness HV (25 mN) | Residual stress fcc-$Ti_{1-x}Al_xC_yN_z$ [MPa] | TC (111) | Position of intensity maximum (111) Pole figure (α) | Lattice constant fcc phase [Å] | Grain boundary precipitations $Ti_{1-o}Al_oC_pN_q$ present | Proportion of fcc phase (according to EBSD)*** | Note |
|---|---|---|---|---|---|---|---|---|---|---|---|
| | x | y | z | | | | | | | | |
| 1 | 0.82 | 0 | 1 | 2956 | +616 | 3.86 | 0° | 4.081 | No* | >96% | comparison |
| 2 | 0.82 | 0 | 1 | 3147 | −393 | 3.53 | n.g. | 4.081 | Yes | >95% | invention |
| 3 | 0.82 | 0 | 1 | 3232 | −1925 | 3.47 | n.g. | 4.082 | Yes | >92% | invention |
| 4 | 0.74 | 0 | 1 | 3183 | −3997 | 3.84 | n.g. | 4.096 | Yes | >90.5% | invention |
| 5 | n.m. | 0 | 1 | 2234 | n.m. | n.m. | n.g. | n.m. | w-AlN** | >3% | comparison |
| 6 | n.m. | 0 | 1 | 2076 | n.m. | n.m. | n.g. | n.m. | w-AlN** | >3% | comparison |
| 7 | 0.79 | 0 | 1 | 2982 | +681 | 3.38 | 10° | 4.087 | No* | >94.6% | comparison |
| 8 | 0.83 | 0 | 1 | 3225 | −123 | 3.46 | 0° | 4.080 | Yes | >94.4% | invention |
| 9 | 0.81 | 0 | 1 | 3101 | −2395 | 3.15 | 0° | 4.083 | Yes | >92% | invention |
| 10 | 0.83 | 0 | 1 | 2774 | −2890 | 2.56 | 0° | 4.080 | w-AlN** | >85.4% | comparison |
| 11 | 0.74 | 0 | 1 | 2303 | n.m. | 1.96 | n.m. | 4.096 | w-AlN** | >37% | comparison | n.g. = not measured/n.m. = not measureable
*= non-annealed
**= electron microscopy image shows a complete conversion of the fcc $Ti_{1-x}Al_xC_yN_z$ crystallites into w-AlN in portions of the imaged areas or in the total imaged area
***= measured on a polished cross-section Cross-sections of the inventive $Ti_{1-x}Al_xC_yN_z$ layers were examined using scanning electron microscopy (SEM) and, after suitable preparation of electron-transparent samples, regions of the lamellae that appear dark in BF and bright in HAADF have higher Ti proportions and lower Al proportions than the regions showing the contrary image contrast.

The regions of higher Ti proportions are in general significantly thinner in the inventive $Ti_{1-x}Al_xC_yN_z$ layers than the Al-rich regions of the lamellar structure. The total composition determined by EDS matched to the total composition determined by XRD.

By high resolution HRTEM images of the lamellar regions it could further be shown that the total structure consists of face-centered cubic (fcc) phase. To show this, Fourier-transformations of sections of the HRTEM image, which include the Ti-richer and the Al-richer regions, were carried out. The spot pattern of the Fourier-transformations comprise the information about crystal symmetry and orientation of the transformed sections corresponding to an electron diffraction image. They show that the entire lamellar structure consists of face-centered cubic (fcc) phase, whereby within one crystallite the same orientation is present. The lattice constant determined from diffraction images is, within the accuracy of the method, consistent with the lattice constant determined by XRD.

Example 2: Cutting Tests

Figure 5:
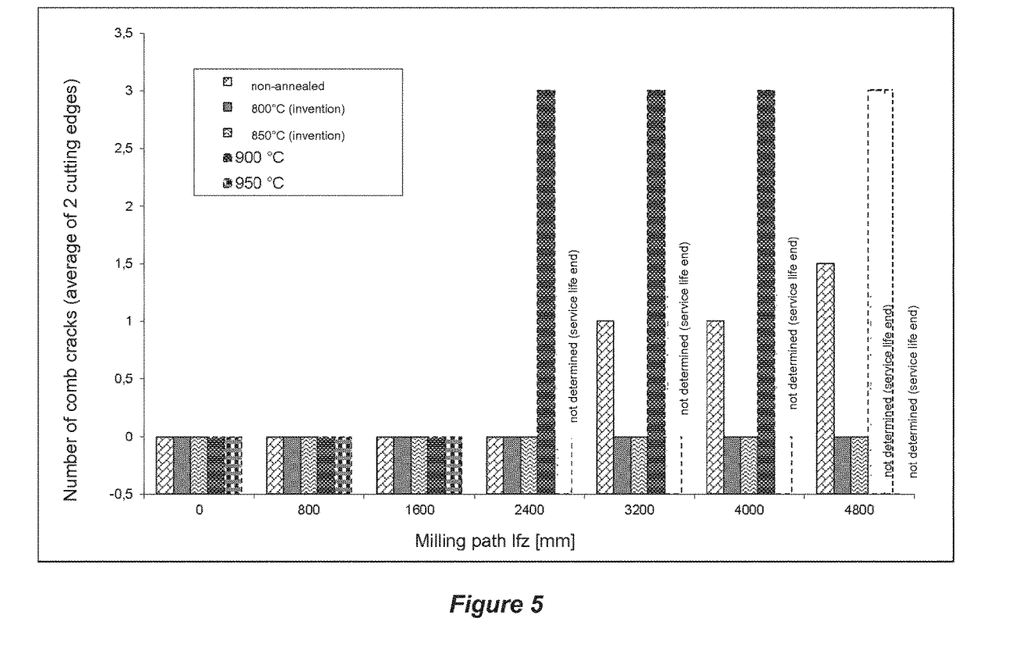
FIGS. 5, 6, 7 show the comb crack formation (FIG. 5), the maximum flank wear (FIG. 6) and the average flank wear (FIG. 7) of the tools 7 to 11 of the subsequent examples annealed for 5 h in the milling test over the milling path.
Figure 6:
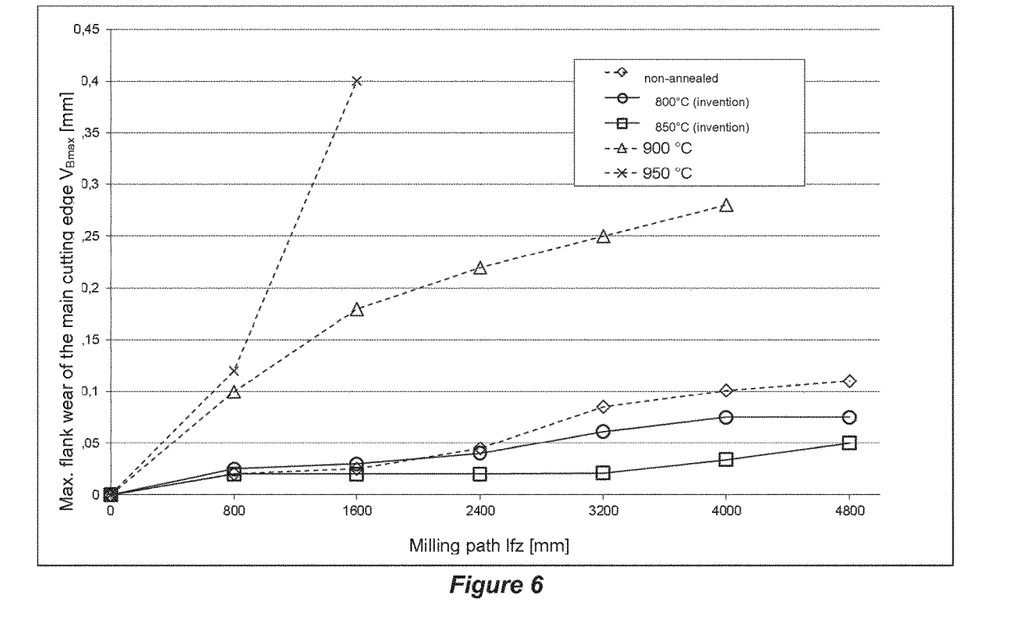
Figure 7:
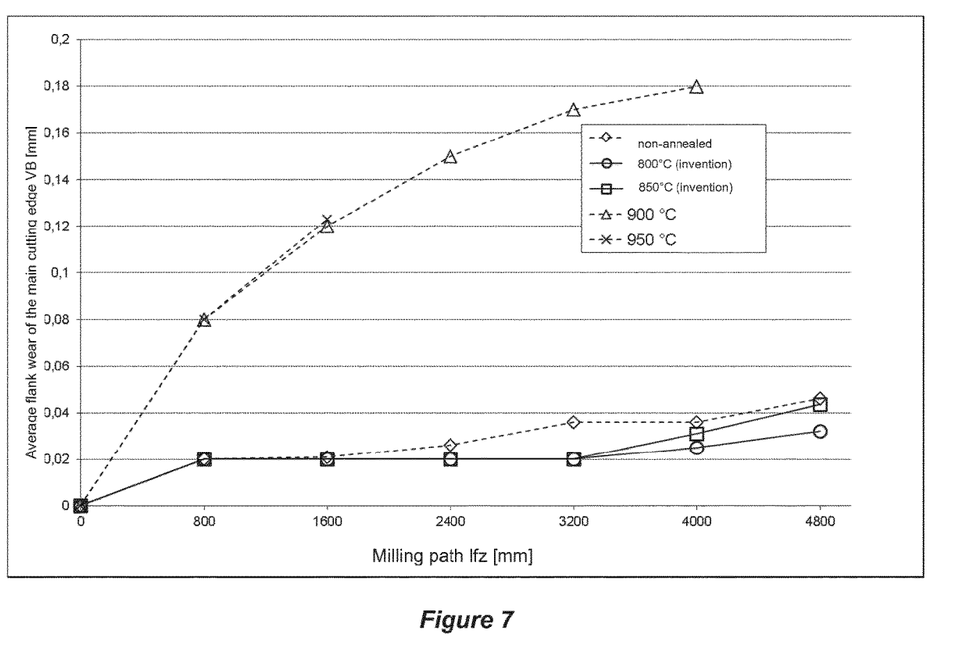

Using the cemented carbide indexable cutting inserts prepared in example 1 (inventive examples Nos. 8 and 9, and comparative examples Nos. 7, 10 and 11) milling operations were carried out under the following cutting conditions:
Work piece material: cast iron GG25
Parallel feed, no coolant used
Feed per tooth: $f_z$=0.2 mm
Depth of cut: $a_p$=3 mm
Cutting speed: $v_c$=283 m/min
Setting angle: κ=45°
Milling width: $a_e$=98 mm
Projection length: $u_e$=5 mm The comb crack formation (FIG. 5), the maximum flank wear $V_{B,max}$ (FIG. 6) and the average flank wear $V_B$ (FIG. 7) of the tools was determined at the main cutting edge after a milling distance of 800 mm, 1600 mm, 2400 mm, 3200 mm, 4000 mm and 4800 mm, respectively. The results are shown in FIGS. 5, 6 and 7.

The invention claimed is:

1. A tool comprising:
a base body of cemented carbide, cermet, ceramics, steel; and
a single-layer or multi-layer wear protection coating deposited on the body by a CVD process, the wear protection coating having a thickness within the range of from 2 μm to 25 μm,
wherein the wear protection coating includes at least a $Ti_{1-x}Al_xC_yN_z$ layer with 0.40≤x≤0.95, 0≤y≤0.10 and 0.85≤z≤1.15 having a thickness in the range of from 1 μm to 16 μm and having >85 vol-% face-centered cubic (fcc) crystal structure, the $Ti_{1-x}Al_xC_yN_z$ layer having precipitations of $Ti_{1-o}Al_oC_pN_q$ at grain boundaries of $Ti_{1-x}Al_xC_yN_z$ crystallites having a higher Al content than inside the crystallites, wherein 0.95≤o≤1.00, 0≤p≤0.10, 0.85≤q≤1.15 and (o−x)≥0.05.

2. The tool according to claim 1, wherein the $Ti_{1-x}Al_xC_yN_z$ layer has at least 90 vol-% of a face-centered cubic (fcc) crystal structure.

3. The tool according to claim 1, wherein the $Ti_{1-x}Al_xC_yN_z$ layer has a columnar microstructure.

4. The tool according to claim 1, wherein the precipitations of $Ti_{1-o}Al_oC_pN_q$ at the grain boundaries of the $Ti_{1-x}Al_xC_yN_z$ crystallites having a higher Al content than inside the crystallites include AlN with a hexagonal crystal structure (w-AlN).

5. The tool according to claim 1, wherein the $Ti_{1-x}Al_xC_yN_z$ layer has stoichiometric coefficients of 0.60≤x≤0.90, y=0 and 0.85≤z≤1.15.

6. The tool according to claim 1, wherein the $Ti_{1-x}Al_xC_yN_z$ layer has a Vickers hardness (HV) of more than 2700 HV.

7. The tool according to claim 1, wherein the $Ti_{1-x}Al_xC_yN_z$ layer has an orientation of crystal growth with respect to a crystallographic {111} plane, and a texture coefficient TC (111)>1.5, wherein the texture coefficient TC (111) is defined as follows:

$$TC(111) = \frac{I(111)}{I_0(111)}\left[\frac{1}{n}\sum_{n=1}^{n}\frac{I(hkl)}{I_0(hkl)}\right]^{-1}$$

wherein
I(hkl) are the intensities of the diffraction reflections measured by X-ray diffraction,
$I_0$(hkl) are the standard intensities of the diffraction reflections according to the pdf card 00-046-1200,
n is the number of reflections used in the calculation, and
for the calculation of TC(111) the reflections (111), (200), (220) and (311) are used.

8. The tool according to claim 1, wherein the $Ti_{1-x}Al_xC_yN_z$ layer has a preferred orientation of crystal growth with respect to a crystallographic {111} plane, a maximum of an X-ray diffraction peak of the crystallographic {111} plane being measured by X-ray diffraction (XRD) and/or by electron back scattering (EBSD) within an angle α=±20 degrees relative to a normal to a surface of the base body.

9. The tool according to claim 1, wherein the $Ti_{1-x}Al_xC_yN_z$ layer has a lamellar structure having lamellae with a thickness of not more than 150 nm, wherein the lamellae are formed from periodically alternating regions of the $Ti_{1-x}Al_xC_yN_z$ layer having alternatingly different stoichiometric proportions of Ti and Al and having the same crystal structure/crystallographic phase, and/or the same crystallographic orientation.

10. The tool according to claim 1, wherein the $Ti_{1-x}Al_xC_yN_z$ layer has residual compressive stresses, within the range of from ≤0 MPa to −5000 MPa measured on a {222} reflection at ≈81.5-82 degrees 2-theta of a fcc-$Ti_{1-x}Al_xC_yN_z$ phase by a $\sin^2 \psi$ method.

11. The tool according to claim 1, wherein between the base body and the $Ti_{1-x}Al_xC_yN_z$ layer there is provided at least one further hard material layer with a thickness of from 0.05 μm to 7 μm, and selected from a TiN layer, a TiCN layer deposited by high-temperature CVD or moderate-temperature CVD (MT-CVD), a $Al_2O_3$ layer, a h-AlN layer and combinations thereof.

12. The tool according to claim 1, wherein above the $Ti_{1-x}Al_xC_yN_z$ layer there is provided at least one further hard material layer, selected from α-$Al_2O_3$, κ-$Al_2O_3$, γ-$Al_2O_3$, TiN, MT-TiCN, h-AlN and combinations thereof.

13. The tool according to claim 1, wherein the base body is high-speed steel.

14. A process for the production of a tool having a base body of cemented carbide, cermet, ceramics, steel and a single-layer or multi-layer wear protection coating deposited thereon by a CVD process and having a thickness within the range of from 2 μm to 25 μm, the process comprising the steps of:
depositing a $Ti_{1-x}Al_xC_yN_z$ layer with 0.40≤x≤0.95, 0≤y≤0.10 and 0.85≤z≤1.15 having a thickness within the range of from 1 µm-16 µm in the CVD process at a process temperature within the range of from 625 to 800° C.;

annealing of the deposited $Ti_{1-x}Al_xC_yN_z$ layer at a temperature within the range of from 700-950° C. for a duration of from 1-6 hours under exclusion of air, wherein the conditions are selected in a way such that at the grain boundaries of $Ti_{1-x}Al_xC_yN_z$ crystallites precipitations of $Ti_{1-o}Al_oC_pN_q$ are generated having a higher Al content than inside the crystallites and with $0.95 \leq o \leq 1.00$, $0 \leq p \leq 0.10$, $0.85 \leq q \leq 1.15$ and $(o-x) \geq 0.05$.

15. The process of claim 14, wherein the conditions of the temperature and the duration during annealing are selected such that after annealing the $Ti_{1-x}Al_xC_yN_z$ layer exhibits a Vickers hardness (HV) of more than 2700 HV.

16. The process of any claim 14, wherein the conditions of the temperature and the duration during annealing are selected such that a remaining content of face-centered cubic (fcc) crystal structure in the $Ti_{1-x}Al_xC_yN_z$ layer, after the generation of the precipitations of $Ti_{1-o}Al_oC_pN_q$ in the $Ti_{1-x}Al_xC_yN_z$ layer after the annealing, is >85 vol-%.

17. The process of claim 14, wherein the annealing of the deposited $Ti_{1-x}Al_xC_yN_z$ layer is carried out at a temperature within the range of from 750-900° C.

18. The process of claim 14, wherein the CVD process for the deposition of the $Ti_{1-x}Al_xC_yN_z$ layer is a LP-CVD process and that the CVD process is carried out at a process pressure in the CVD reactor within the range of from 0.05 to 8 kPa.

19. The process of claim 14, wherein the base body is high-speed steel.

* * * * *